(12) United States Patent
Ohashi

(10) Patent No.: US 7,456,530 B2
(45) Date of Patent: Nov. 25, 2008

(54) MAGNETOSTRICTIVE ACTUATOR

(75) Inventor: Yoshio Ohashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/625,531

(22) Filed: Jan. 22, 2007

(65) Prior Publication Data

US 2007/0194636 A1   Aug. 23, 2007

Related U.S. Application Data

(63) Continuation of application No. 11/082,800, filed on Mar. 18, 2005, now abandoned.

(30) Foreign Application Priority Data

Mar. 19, 2004   (JP)   ............................. 2004-080967

(51) Int. Cl.
*H01L 41/12* (2006.01)
*H02N 2/02* (2006.01)

(52) U.S. Cl. ...................................................... 310/26
(58) Field of Classification Search .................... 310/26
See application file for complete search history.

(56) References Cited

U.S. PATENT DOCUMENTS

| | | | | |
|---|---|---|---|---|
| 4,257,022 A | * | 3/1981 | Deschamps | 333/201 |
| 4,605,911 A | * | 8/1986 | Jin | 333/144 |
| 5,184,037 A | * | 2/1993 | Kobayashi et al. | 310/26 |
| 5,249,117 A | * | 9/1993 | Greenough et al. | 700/30 |
| 5,406,153 A | * | 4/1995 | Flatau et al. | 310/26 |
| 5,701,043 A | * | 12/1997 | Razzaghi | 310/26 |
| 6,037,682 A | * | 3/2000 | Shoop et al. | 310/26 |
| 6,570,298 B2 | * | 5/2003 | Yasuda | 310/328 |

FOREIGN PATENT DOCUMENTS

| | | | |
|---|---|---|---|
| JP | 02-237477 | * | 9/1990 |
| JP | 3-60176 | * | 3/1991 |
| JP | 06-086575 A | * | 3/1994 |
| JP | 07-015053 | | 7/1995 |
| JP | 07-222465 | * | 8/1995 |
| SU | 1114478 | * | 8/1984 |
| WO | 01/67432 | * | 9/2001 |

* cited by examiner

*Primary Examiner*—Burton Mullins
(74) *Attorney, Agent, or Firm*—Oblon, Spivak, McClelland, Maier & Neustadt, P.C.

(57) ABSTRACT

A magnetostrictive actuator has magnetostrictive element having a magnetostrictive, a driving rod moving in a displacement direction of the magnetostrictive element, which is connected with the magnetostrictive element and made of a ferromagnet, a solenoid coil applying magnetic field to the magnetostrictive element, which is arranged around the magnetostrictive element, an enclosure enclosing the magnetostrictive element and the solenoid coil. In the enclosure, a permanent magnet for applying static magnetic bias field to the magnetostrictive element and tubular cases including a ferromagnet are arranged around the enclosed magnetostrictive element, and the driving rod is arranged in the enclosure with a space. Magnetic pull-in force caused between the driving rod and the enclosure can apply prestress to the magnetostrictive element.

3 Claims, 4 Drawing Sheets

F I G. 2
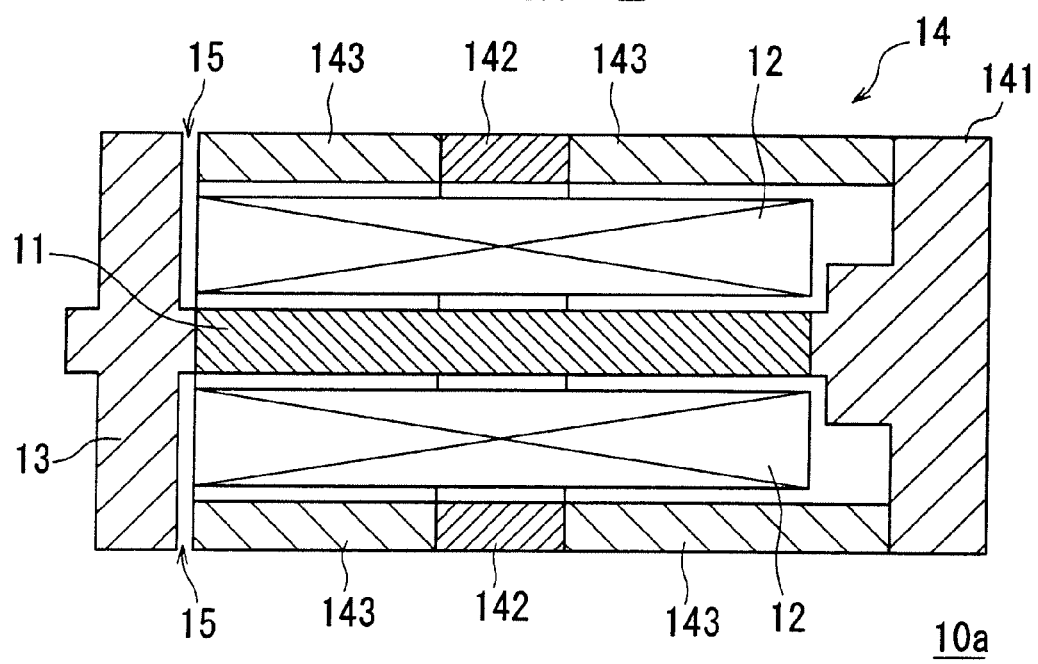

MAGNETOSTRICTIVE ACTUATOR

CROSSREFERENCE TO RELATED APPLICATION

This application is a continuation of U.S. patent application Ser. No. 11/082,800, filed Mar. 18, 2005, now abandoned. The present invention contains subject matter related to Japanese Patent Application JP 2004-080967 filed in the Japanese Patent Office on Mar. 19, 2004, the entire contents of which being incorporated herein by reference.

FIELD OF THE INVENTION

The present invention relates to a magnetostrictive actuator. More particularly, it relates to a magnetostrictive actuator for generating displacement or vibration by utilizing a magnetostrictive event.

BACKGROUND

As an actuator for generating displacement or vibration, a piezoelectric actuator for generating displacement by applying a control voltage to a displacement-generation element using piezoelectric material has been known. A magnetostrictive actuator for generating displacement by applying a magnetic field to a displacement-generation element (referred to as a "magnetostrictive element" hereinafter) using magnetostrictive material has been also known.

A magnetic circuit capable of controlling magnetic field easily by supplying control current thereto is used in the magnetostrictive actuator. Applying the magnetic field generated by the magnetic circuit to the magnetostrictive element allows displacement of the magnetostrictive element to be controlled. As the magnetostrictive material, an Ni magnetostrictive alloy, a Fe—Al magnetostrictive alloy, or a ferrite magnetostrictive alloy have been often used. Further, a rare earth metal and transition metal magnetostrictive supperalloy that generates displacement with an order of magnitude large as compared by these magnetostrictive materials has been developed for commercial use.

The magnetostrictive element generates displacement along its extension or compressive direction based on the strength of the applied magnetic field, not a direction of the magnetic field. Thus, to the magnetostrictive element that generates displacement along its extension direction, for example, an initial displacement based on a static magnetic bias field previously applied can be extended only by an order applied by the magnetic bias field. In a condition where an initial static magnetic bias field is previously applied thereto, if an additional magnetic field generated by the magnetic circuit is applied to the magnetostrictive element, the element can be further displaced along its extension or compressive direction from the initial displacement condition based on the magnetic field generated by the magnetic circuit. In other words, the magnetostrictive element can generate displacement based on a control current. Alternatively, if the magnetostrictive element generates displacement along its compressive direction, the static magnetic bias field is previously applied to the magnetostrictive element so that any initial displacement can be applied to the magnetostrictive element by compressing it by only an order applied by the magnetic bias field, thereby allowing additional displacement to be generated in the magnetostrictive element based on a control current. By disposition of any permanent magnet in a magnet circuit, application of the static magnetic bias field to the magnetostrictive element can be carried out. Namely, the disposition of a permanent magnet in the magnet circuit causes magnetic field generated by the permanent magnet to be applied to the magnetostrictive element as the static magnetic bias field.

If external stress (hereinafter referred to as "prestress") is previously applied to the magnetostrictive element, larger displacement occurs when applying a magnetic field thereto as compared by a case where no prestress is applied thereto. Thus, any prestress has been often applied to magnetostrictive actuator using any magnetostrictive element to increase its displacement. The prestress depends on material constituting the magnetostrictive element. For example, in a Ni magnetostrictive alloy, displacement occurs in its compressive direction so that an initial strain stress is applied as prestress, thereby obtaining larger displacement. In each of the Fe—Al magnetostrictive alloy, ferrite magnetostrictive alloy, and rare earth metal and transition metal magnetostrictive supperalloy, on the other hand, displacement occurs in its extension direction so that an initial compressive stress is applied as prestress, thereby obtaining larger displacement.

Japanese Patent Application Publication No. H07-15053 discloses a magnetostrictive actuator, as shown in FIG. 1, including a rod-like magnetostrictive element 31 made of magnetostrictive alloy, a solenoid coil 32, which is arranged around the magnetostrictive element 31, for applying controlling magnetic field to the magnetostrictive element 31, a driving rod 33 connected to an end of the magnetostrictive element 31 to propagate any displacement outputs of the magnetostrictive actuator, a fixed base plate 34 connected to the other end of the magnetostrictive element 31, a tubular case 35 attached to the fixed base plate 34 so as to be arranged around the solenoid coil 32. A permanent magnet 36 is attached to the fixed base plate 34. The permanent magnet 36 allows the magnetic bias field to be applied to the magnetostrictive element 31.

The driving rod 33 and the cylinder-like case 35 are connected to each other thorough the flexible connecting part 37. The flexible connecting part 37 is connected to the driving rod 33 and the tubular case 35 so that it can be flexible in a driving direction of the magnetostrictive actuator but solid in a direction perpendicular to the driving direction. This connecting part 37 has a configuration such that it has little effect on the displacement output of the magnetostrictive element 31, thereby realizing a design to decrease in a loss of the displacement output thereof.

SUMMARY OF THE INVENTION

In the above magnetostrictive actuator, as shown in FIG. 1, in order to allow the magnetostrictive actuator to gain larger displacement, the connecting part 37 has been previously bent, thereby allowing its restoring force to apply a prestress to the magnetostrictive element 31. If, however, a period of displacement is too short when such a restoring force is used, it is difficult for a restoration of the connecting part 37 to follow the displacement of magnetostrictive element 31. This results in applying a prestress to the magnetostrictive element 31 unstably. Further, applying a prestress to the magnetostrictive element 31 unstably may gain no displacement output according to the control current when the current is flowing through the solenoid coil 32.

Additionally, the permanent magnet 36 is attached to the fixed base plate 34 so that a magnetic bias field applied to the magnetostrictive element 31 can become stronger at a side of the fixed base plate 34 of the magnetostrictive element 31 but weaker at side of the driving rod 33 thereof. This may prevent a uniform magnetic bias field from being applied to the magnetostrictive element 31.

It is desirable to provide a magnetostrictive actuator that is capable of gaining a larger displacement output with decrease in losses of the displacement output and easy to be downsized at a relatively low cost.

According to an embodiment of the invention, there is provided a magnetostrictive actuator having displacement-generating means configured to generate a displacement caused by magnetic material having a magnetostrictive element. The actuator also has a movable means configured to move in a displacement direction of the displacement-generating means. The movable means is connected with the displacement-generating means and made of a ferromagnet. The actuator further has magnetic-field-generating means configured to apply a magnetic field to the displacement-generating means. The magnetic-field-generating means is arranged around the displacement-generating means. The actuator additionally has an enclosing device configured to enclose the displacement-generating means and the movable means.

In the enclosing means, magnetic-circuit-forming member including a ferromagnet and a permanent magnet for applying a static magnetic bias field to the displacement-generating means are arranged around the enclosed displacement-generating means. The movable means is arranged in the enclosing means with a space, thereby allowing magnetic pull-in force caused between the movable means and the enclosing means to apply prestress to the displacement-generating means.

The sealing member having flexibility seals the space between the movable means and the enclosing means. In the enclosing means, a plurality of permanent magnets is arranged in a displacement direction of the displacement-generating means with an interval therebetween.

According to another embodiment of the invention, there is also provided a magnetostrictive actuator having displacement-generating device configured to generate a displacement caused by magnetic material having a magnetostrictive characteristic. The actuator also has a movable member configured to move in a displacement direction of the displacement-generating device. The movable member is connected with the displacement-generating device and made of a ferromagnet. The actuator further has a magnetic-field-generating device configured to apply a magnetic field to the displacement-generating device. The magnetic-field-generating device is arranged around the displacement-generating device. The actuator additionally has an enclosing device configured to enclose the displacement-generating device and the movable member.

In the enclosing device, a magnetic-circuit-forming member including a ferromagnet and a permanent magnet for applying a static magnetic bias field to the displacement-generating device are arranged around the enclosed displacement-generating device. The movable member is arranged in the enclosing device with a space, thereby allowing magnetic pull-in force caused between the movable member and the enclosing device to apply prestress to the displacement-generating device.

The concluding portion of this specification particularly points out and directly claims the subject matter of the present invention. However those skill in the art will best understand both the organization and method of operation of the invention, together with further advantages and objects thereof, by reading the remaining portions of the specification in view of the accompanying drawing(s) wherein like reference characters refer to like elements.

According to the embodiments of the invention, a magnetic pull-in force caused between the movable member and the enclosing device is allowed to apply prestress to the displacement-generating device. Since no friction with a bearing for supporting the movable member occurs, it is possible to decrease a loss of the displacement output of the magnetostrictive actuator significantly. Further, by a magnetic pull-in force, any prestress is applied to the displacement-generating device, so that, even if a period of displacement in the displacement-generating device is too short, it is possible to keep applying the prestress thereto, thereby gaining a proper displacement output. Since a bearing for supporting the movable member, a connecting member for connecting the movable member and the enclosure, a spring or the like for applying the prestress to the displacement-generating device are not necessary, it is possible to make the magnetostrictive actuator easily downsized at a relatively low cost.

The sealing member having flexibility seals the space between the movable means and the enclosing means. This prevents a foreign body from being inserted into the magnetostrictive actuator to adversely affect operations of the magnetostrictive actuator. The sealing member has flexibility so that it is possible for the sealing member to decrease a loss of the displacement output of the magnetostrictive actuator.

Further, in the enclosure, a plurality of permanent magnets is arranged in a displacement direction of the displacement-generating means with an interval therebetween. Thus, it is possible to make a magnetic bias field that is applied to the displacement-generating device more uniform.

BRIEF DESCRIPTION OF THE DRAWINGS

FIG. 2 is a conceptually cross-sectional diagram for showing a configuration of a first embodiment of a magnetostrictive actuator according to the invention;

DESCRIPTION OF THE INVENTION

Figure 1:
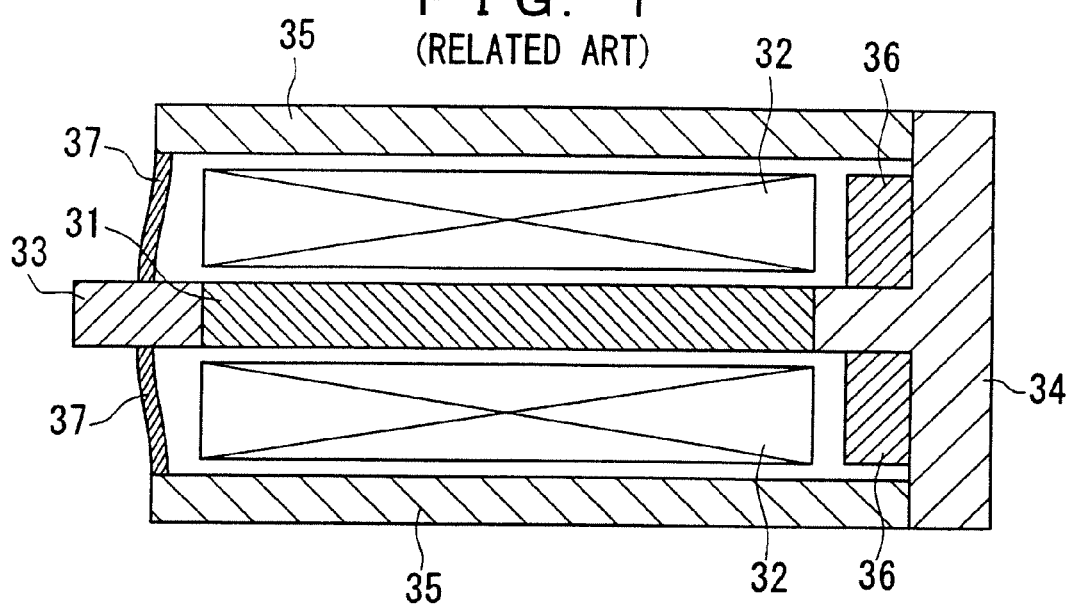
FIG. 1 is a conceptually cross-sectional diagram for showing a configuration of a magnetostrictive actuator according to related art.

The following will describe embodiments of the present invention with reference to drawings. FIG. 2 shows a configuration of a first embodiment of a magnetostrictive actuator 10a according to the invention. The magnetostrictive actuator 10a has a rod-like magnetostrictive element 11 as displacement-generating device generating a displacement in a extending direction, solenoid coil 12 as a magnetic-field-generating device applying a magnetic field to the magnetostrictive element 11, which is arranged around the magnetostrictive element 11, a driving rod 13 as the movable member transmitting the displacement output of the magnetostrictive actuator 10a by being connected with an end of the magnetostrictive element 11, the enclosure 14 enclosing the magnetostrictive element 11 and the solenoid coil 12.

The enclosure 14 has a fixed base plate 141, a permanent magnet 142, and tubular cases 143. To the fixed base plate 141, the other end of the magnetostrictive element 11 is connected and the fixed base plate 141 supports the magnetostrictive element 11. The permanent magnet 142 applying a static magnetic bias field to the magnetostrictive element 11, and the tubular cases 143 as magnetic-circuit-forming members are arranged around the enclosed magnetostrictive element 11. The tubular cases 143 are arranged at both sides of the driving rod 13 and the fixed base plate 141 of the permanent magnet 142. By being manufactured of a ferromagnet, the tubular cases 143 can effectively apply the static magnetic bias filed to the magnetostrictive element 11. By being also manufactured of a ferromagnet, the fixed base plate 141 also can further effectively apply the static bias magnetic filed to the magnetostrictive element 11.

The driving rod 13 is arranged in the enclosure 14 with a space or gap 15, and the driving rod 13 is also made of a ferromagnet so that the rod 13 can be pulled in by the permanent magnet 142. This allows magnetic pull-in force to be generated between the driving rod 13 and the enclosure 14 to apply the prestress to the magnetostrictive element 11 equipped with the driving rod 13.

Figure 3:
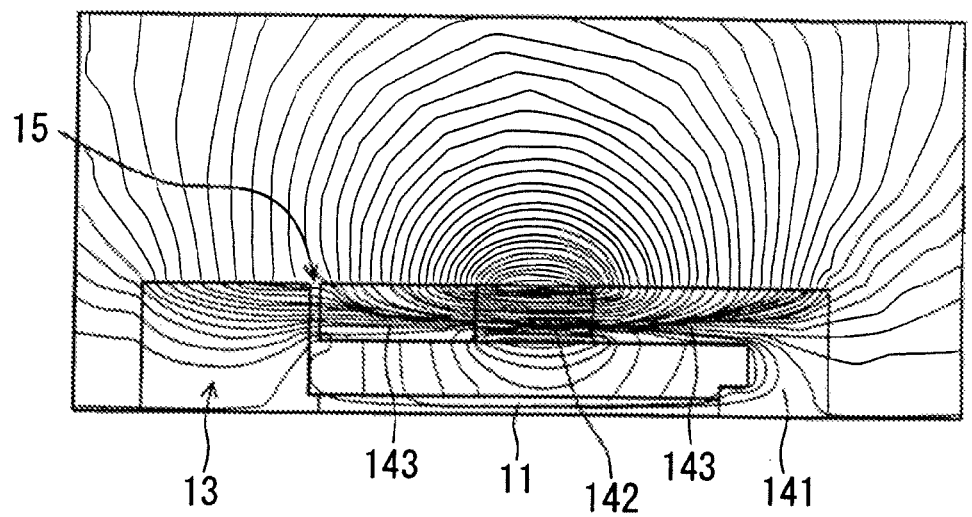
FIG. 3 is a diagram for showing magnetic flux lines in the first embodiment.

FIG. 3 shows magnetic flux lines in the first embodiment. The magnetic flux lines starting from the permanent magnet 142 passes through one of the tubular cases 143 towards the permanent magnet 142 via the gap 15, the driving rod 13, the fixed base plate 141, and the other tubular case 143. This allows a magnetic pull-in force to be generated between the driving rod 13 and the enclosure 14, thereby applying the prestress to the magnetostrictive element 11 by the force. Part of the magnetic flux lines also passes through the one of the tubular cases 143 towards the permanent magnet 142 via the gap 15, the driving rod 13, the magnetostrictive element 11, the fixed base plate 141, and the other tubular case 143. Thus, this allows the static magnetic bias field to be applied to the magnetostrictive element 11.

In the magnetostrictive actuator 10a thus configured, no bearing supports the driving rod, so that any friction of a bearing with the driving rod 13 cannot occur, thereby decreasing a loss of the displacement output of the magnetostrictive actuator 10a significantly. Further, the prestress is applied to the magnetostrictive element 11 by the magnetic full-in force, so that even if a period of displacement of the magnetostrictive element 11 is too short, the actuator 10a keeps the prestress to be applied to it with stability, thereby gaining a proper displacement output according to the control current supplied to the solenoid coil 12. The permanent magnet 142 intervenes between two tubular cases 143. This allows static magnetic bias field applied to the magnetostrictive element 11 to be made uniform in comparison with case where a permanent magnet is arranged on a position of the fixed base plate 141. Further, since a bearing for supporting the movable member, a connecting member for connecting the movable member and the enclosure, a spring or the like for applying prestress to the displacement-generating device are not necessary, it is possible to make the magnetostrictive actuator easily downsized at a relatively low cost.

In the first embodiment, however, the gap 15 is arranged between the driving rod 13 and the enclosure 14 so that a foreign body may be inserted from the gap into inside. The following will describe a magnetostrictive actuator 10b that prevents the foreign body from being inserted into inside.

Figure 4:
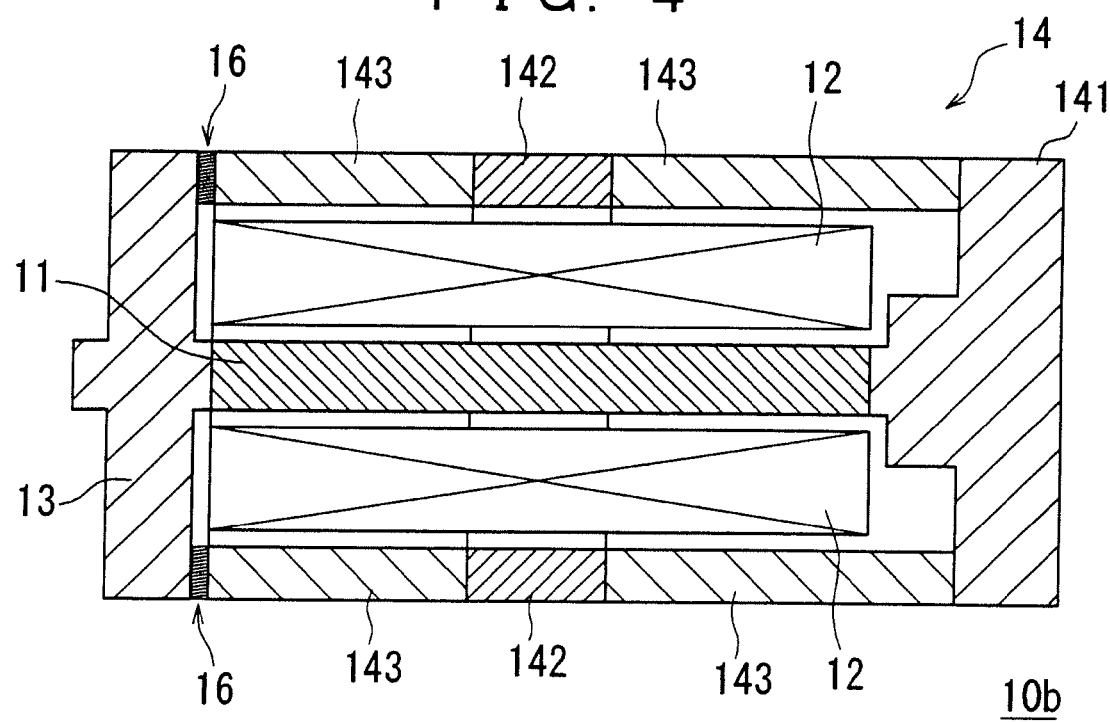
FIG. 4 is a conceptually cross-sectional diagram for showing a configuration of a second embodiment of a magnetostrictive actuator according to the invention.

FIG. 4 shows a configuration of a second embodiment of magnetostrictive actuator according to the invention. In FIG. 4, like members corresponding to the ones shown in FIG. 1 are applied to like symbols, a description of which will be deleted.

In the second embodiment of the magnetostrictive actuator 10b, sealing member 16 is inserted into the gap 15 of the first embodiment. As the sealing member 16, in order to prevent a loss of the displacement output from resulting in the magnetostrictive actuator 10b, materials of a low hardness having flexibility such as silicon-based resin or rubber-based resin are used. As the sealing member 16, magnetic flux or the like may be used to seal the gap 15. Thus, according to the second embodiment, the gap 15 is sealed to prevent a foreign body from being inserted into the inside of the magnetostrictive actuator, thereby avoiding the foreign body from being inserted into inside to adversely affecting operations of the magnetostrictive actuator.

The following will describe a third embodiment of a magnetostrictive actuator of the invention. The third embodiment refers to a magnetostrictive actuator 10c that is can make the static magnetic bias field applied to the magnetostrictive element 11 more uniform as compared by the above cases of the first and second embodiments.

Figure 5:
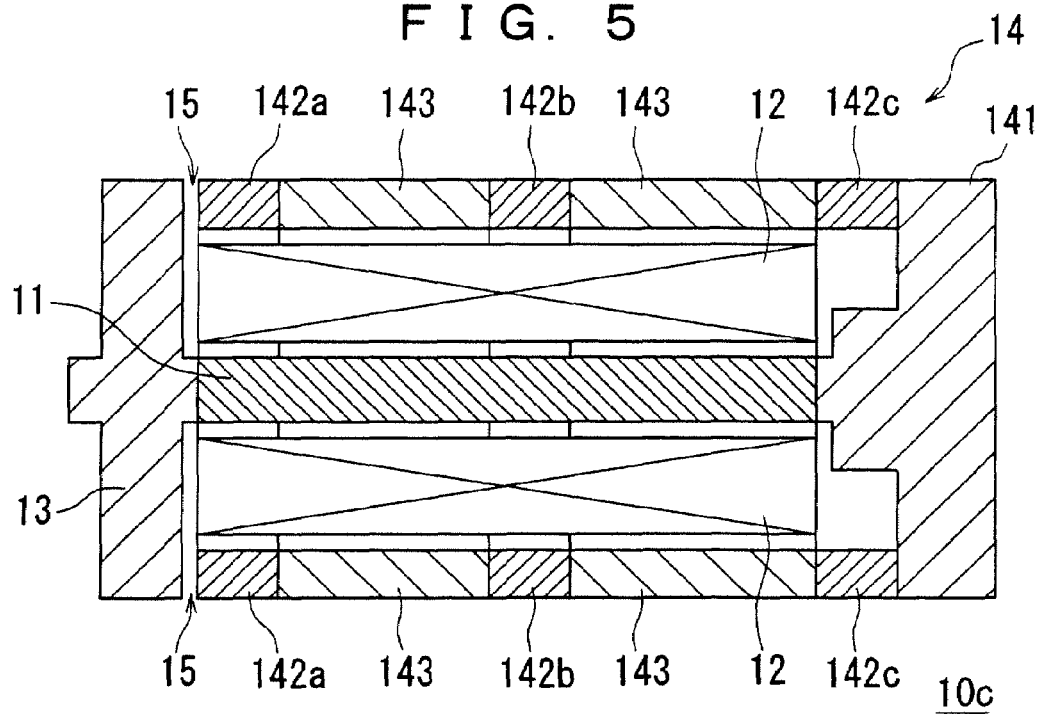
FIG. 5 is a conceptually cross-sectional diagram for showing a configuration of a third embodiment of a magnetostrictive actuator according to the invention.

FIG. 5 shows a configuration of a third embodiment of magnetostrictive actuator according to the invention. In FIG. 5, like members corresponding to the ones shown in FIG. 1 are applied to like symbols, a description of which will be deleted.

In the magnetostrictive actuator 10c, in order to make the static magnetic bias field applied to the rod-like magnetostrictive element 11 uniform, a plurality of permanent magnets 142 is arranged in a displacement direction of the magnetostrictive element 11 (i.e. an axis direction of the rod-like magnetostrictive element 11) with an interval therebetween. For example, as shown in FIG. 5, a first permanent magnet 142a is arranged in a side of the driving rod 13. On the other hand, a third permanent magnet 142c is arranged in a side of the fixed base plate 141. Further, a second permanent magnet 142b is arranged in a middle of the first and third permanent magnets 142a and 142c. Each of the tubular cases 143 is arranged between the first and second permanent magnets 142a and 142b and between the second and third permanent magnets 142b and 142c. Thus, a plurality of permanent magnets 142 is arranged in a displacement direction of the magnetostrictive element 11 with an interval therebetween, thereby applying static magnetic bias field to the magnetostrictive element 11.

Figure 6:
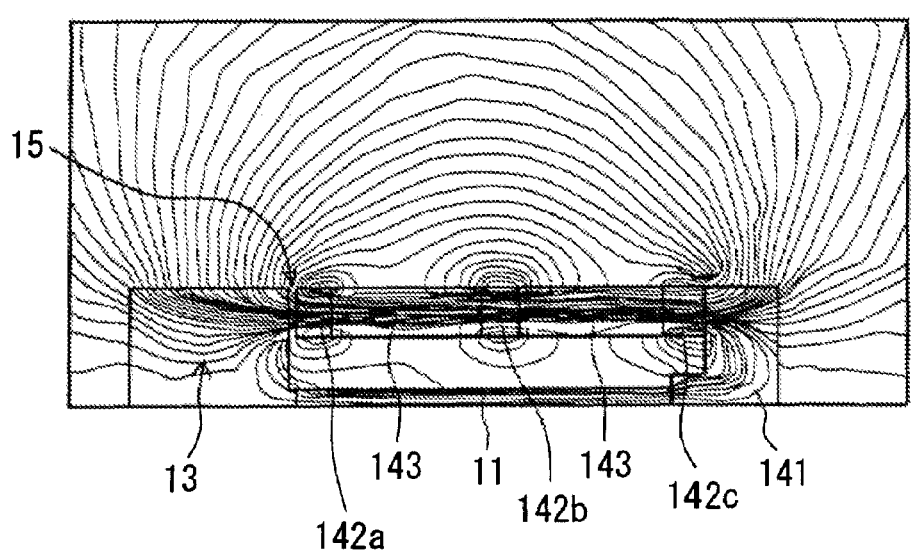
FIG. 6 is a diagram for showing magnetic flux lines in the third embodiment.

FIG. 6 shows magnetic flux lines in the third embodiment. The magnetic flux lines starting from the three permanent magnets 142a through 142c passes through the tubular cases 143 towards the permanent magnets 142a through 142c via the space 15, the driving rod 13, and the fixed base plate 141. This allows a magnetic pull-in force to be generated between the driving rod 13 and the magnet 142a, thereby applying the prestress to the magnetostrictive element 11 by the force. Part of the magnetic flux lines also passes through the tubular cases 143 towards the permanent magnets 142 via the space 15, the driving rod 13, the magnetostrictive element 11, and the fixed base plate 141. Thus, this allows the static magnetic bias field to be applied to the magnetostrictive element 11. Further, the permanent magnets 142a through 142c are arranged in a displacement direction of the magnetostrictive element 11 so that they can make the static magnetic bias field applied to the magnetostrictive element 11 more uniform, as compared by each of the cases of the first and second embodiments where one permanent magnet is arranged.

Thus, according to the third embodiment, as in the first embodiment, it is possible to decrease a loss of the displacement output of the magnetostrictive actuator 10c significantly. Further, it is also possible to gain proper displacement output according to the control current supplied to the solenoid coil 12 and easily down-size it. It is further possible to make more uniform the static magnetic bias field applied to the magnetostrictive element 11.

Figure 7:
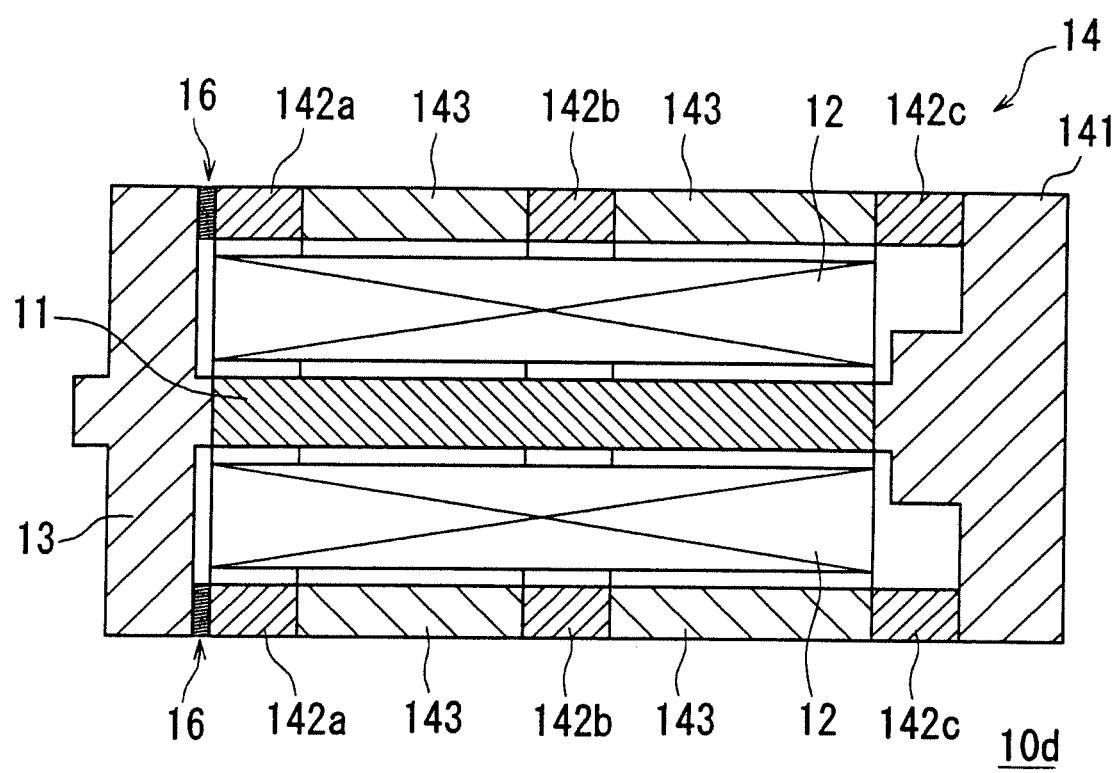
FIG. 7 is a conceptually cross-sectional diagram for showing a configuration of a fourth embodiment of a magnetostrictive actuator according to the invention.

The following will describe a fourth embodiment of this invention in which sealing member 16 seals the space 15 of the third embodiment as the second embodiment. FIG. 7 shows a configuration of the fourth embodiment of a magnetostrictive actuator 10d according to the invention. In FIG. 7, like members corresponding to the ones shown in FIG. 1 are applied to like symbols, a description of which will be deleted.

In the fourth embodiment of the magnetostrictive actuator 10d, the sealing member 16 is inserted into the gap 15 of the third embodiment. As the sealing member 16, in order to prevent a loss of the displacement output from resulting in the magnetostrictive actuator 10d, materials of a low hardness having flexibility are used as the second embodiment.

Thus, according to the fourth embodiment, the sealing member 16 seals the gap 15 to prevent the foreign body from being inserted into the inside of the magnetostrictive actuator, thereby avoiding the foreign body from being inserted into the inside to adversely affecting operations of the magnetostrictive actuator.

In the first embodiment, the magnetostrictive element 11 is made of terbium-dysprosium-iron (Tb—Dy—Fe) alloy having its component of $Tb_{0.33}Dy_{0.66}Fe_{1.9}$. This magnetostrictive element 11 has a diameter of 1.0 mm and a length of 10 mm. The driving rod 13 and the tubular cases 143 are made of carbon steel S15C. Each of the tubular cases 143 has an inner diameter of 4.5 mm, an outer diameter of 8.0 mm, and a length of 4.0 mm. An outer diameter of the driving rod 13 is similar to those of each of the tubular cases 143 or the permanent magnet 142a. As the permanent magnets 142, 142a, 142b, and 142c, neodymium-iron-boron (Nd—Fe—B) magnet, for example, NEOMAX 32H, a magnet made by NEOMAX MATERIALS Co., Ltd. having maximum energy product, BHmax of 32MGOe are used. Each of them has an inner diameter of 4.5 mm, an outer diameter of 8.0 mm, and a length of 3.0 mm and their direction of magnetization is displacement direction of the magnetostrictive element 11. If the gap 15 is provided as having its amount of clearance of 0.2 mm, a calculation result of compressive force applied to the magnetostrictive element 11 was $1.3 \times 10^6$ N/m². Further, in the third embodiment, when a height of each of the permanent magnets 142, 142a, 142b, and 142c is set to 1.0 mm, a calculation result of compressive force applied to the magnetostrictive element 11 was $8.0 \times 10^6$ N/m². Thus, the driving rod 13 is mounted to the enclosure 14 with the gap 15 so that compressive force can be applied to the magnetostrictive element 11.

As described above, the embodiments of the magnetostrictive actuator of the invention is available to an actuator having a good response and a little loss of the displacement and is preferably applied to various kinds of fields, for example, vibration-controlling apparatus, positioning apparatus, voice output apparatus, and a pump.

Thus have been described the magnetostrictive actuator. It should be understood by those skilled in the art that various modifications, combinations, sub-combinations and alternations may occur depending on design requirements and other factors insofar as they are within the scope of the appended claims or the equivalents thereof.

What is claimed is:

1. A magnetostrictive actuator comprising:
   displacement-generating means configured to generate a displacement caused by magnetic material having a magnetostrictive characteristic;
   movable means configured to move in a displacement direction of the displacement-generating means, said movable means being connected with the displacement-generating means and made of a ferromagnet;
   magnetic-field-generating means configured to apply a magnetic field to the displacement-generating means, said magnetic-field-generating means being arranged around the displacement-generating means; and
   an enclosing device configured to enclose the displacement-generating means, in the enclosing device, magnetic-circuit-forming member including a plurality of magnetic circuit forming members and a plurality of permanent magnets for applying static magnetic bias field to the displacement-generating means are arranged in a displacement direction around the enclosed displacement-generating means at fixed intervals,
   wherein the movable means is arranged relative to the enclosing device to form a gap therebetween, allowing magnetic bias force exerted between the movable means and the enclosing means to apply prestress to the displacement-generating means, and
   wherein the gap, plurality of magnetic circuit forming members and plurality of permanent magnets are arranged in a linear direction parallel to an axis of the displacement-generating means.

2. The magnetostrictive actuator according to claim 1, wherein a sealing member having flexibility seals the space between the movable means and the enclosing means.

3. A magnetostrictive actuator comprising:
   a displacement-generating device configured to generate a displacement caused by magnetic material having a magnetostrictive characteristic;
   a movable member configured to move in a displacement direction of the displacement-generating device, said movable member being connected with the displacement-generating device and made of a ferromagnet;
   a magnetic-field-generating device configured to apply a magnetic field to the displacement-generating device, said magnetic-field-generating device being arranged around the displacement-generating device; and
   an enclosing device configured to enclose the displacement-generating device, in the enclosing device, magnetic-circuit-forming members including a plurality of magnetic circuit forming members and a plurality of permanent magnets for applying static magnetic bias field to the displacement-generating device are arranged in a displacement direction around the enclosed displacement-generating device at fixed intervals,
   wherein the movable member is arranged relative to the enclosing device to form a gap therebetween, allowing magnetic bias force exerted between the movable member and the enclosing device to apply prestress to the displacement-generating device,
   wherein the gap, plurality of magnetic circuit forming members and plurality of permanent magnets are arranged in a linear direction parallel to an axis of the displacement-generating device.

* * * * *